(12) United States Patent
Nakaiso et al.

(10) Patent No.: US 9,460,859 B2
(45) Date of Patent: Oct. 4, 2016

(54) DIELECTRIC THIN FILM ELEMENT, ANTIFUSE ELEMENT, AND METHOD OF PRODUCING DIELECTRIC THIN FILM ELEMENT

(71) Applicant: MURATA MANUFACTURING CO., LTD., Nagaokakyo-Shi, Kyoto-Fu (JP)

(72) Inventors: Toshiyuki Nakaiso, Nagaokakyo (JP); Yutaka Takeshima, Nagaokakyo (JP); Yutaka Ishiura, Nagaokakyo (JP); Yuji Irie, Nagaokakyo (JP); Shinsuke Tani, Nagaokakyo (JP); Jun Takagi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 551 days.

(21) Appl. No.: 13/795,677

(22) Filed: Mar. 12, 2013

(65) Prior Publication Data

US 2013/0194714 A1    Aug. 1, 2013

Related U.S. Application Data

(63) Continuation of application No. PCT/JP2011/070219, filed on Sep. 6, 2011.

(30) Foreign Application Priority Data

Sep. 13, 2010 (JP) .................................. 2010-204668

(51) Int. Cl.
| | |
|---|---|
| H01G 4/30 | (2006.01) |
| H01G 4/33 | (2006.01) |
| H01L 23/522 | (2006.01) |
| H01L 23/525 | (2006.01) |
| H01L 27/01 | (2006.01) |

(52) U.S. Cl.
CPC ............ *H01G 4/33* (2013.01); *H01L 23/5223* (2013.01); *H01L 23/5252* (2013.01); *H01L 27/016* (2013.01); *H01L 2924/0002* (2013.01)

(58) Field of Classification Search
CPC ....................................................... H01G 4/306
USPC ............................................... 361/301.4, 311
See application file for complete search history.

(56) References Cited

U.S. PATENT DOCUMENTS

| | | | |
|---|---|---|---|
| 6,656,828 B1 | 12/2003 | Maitani et al. | |
| 2007/0176175 A1* | 8/2007 | Shioga et al. | .................. 257/40 |

FOREIGN PATENT DOCUMENTS

| | | |
|---|---|---|
| JP | 06-089831 A | 3/1994 |
| JP | 2000-044043 A | 2/2000 |

(Continued)

OTHER PUBLICATIONS

PCT/JP2011/070219 Written Opinion dated Jun. 10, 2011.

*Primary Examiner* — Eric Thomas
(74) *Attorney, Agent, or Firm* — Arent Fox LLP

(57) ABSTRACT

A dielectric thin film element having a high humidity resistance is provided. A dielectric thin film element includes a capacitance section having a dielectric layer and a pair of electrode layers formed on the respective upper and lower surfaces of the dielectric layer 22. Furthermore, a protection layer is provided on the capacitance section, a pair of interconnect layers are drawn out to an upper surface of the protection layer, and external electrodes are formed to be electrically connected to the interconnect layers. Further, first surface metal layers cover a portion of the interconnect layers that extends along the inner surface of the openings and second surface metal layers are formed at end of the first surface metal layers.

9 Claims, 14 Drawing Sheets

(56) References Cited

FOREIGN PATENT DOCUMENTS

| JP | 2004-018964 A | 1/2004 |
| JP | 2005-019522 A | 1/2005 |
| JP | 2010-171386 A | 8/2010 |
| WO | WO-2007-046173 A1 | 4/2007 |

\* cited by examiner (A)

(B)

(C)

(D)

(E)

(F)

(G)

(H)

(I)

(J)

DIELECTRIC THIN FILM ELEMENT, ANTIFUSE ELEMENT, AND METHOD OF PRODUCING DIELECTRIC THIN FILM ELEMENT

CROSS REFERENCE TO RELATED APPLICATIONS

The present application is a continuation of International Application No. PCT/JP2011/070219, filed Sep. 6, 2011, which claims priority to Japanese Patent Application No. 2010-204668, filed Sep. 13, 2010, the entire contents of each of which are incorporated herein by reference.

FIELD OF THE INVENTION

The present invention relates to a dielectric thin film element and a method of producing the same. The present invention further relates to an antifuse element provided with a dielectric thin film element.

BACKGROUND OF THE INVENTION

In recent years, researches of a dielectric thin film element used in thin film capacitors, antifuse elements, and the like are eagerly carried out. As a conventional dielectric thin film element, for example, the one disclosed in Patent Document 1 is known in the art. Referring to FIG. 16, this dielectric thin film element includes a lower electrode layer 102, a dielectric layer 103, an upper electrode layer 104, a protection layer 105, and interconnect layers 107-1, 107-2. The lower electrode layer 102, the dielectric layer 103, and the upper electrode layer 104 are sequentially formed on a substrate 101. Also, the protective layer 105 is formed to cover the lower electrode layer 102, the dielectric layer 103, and the upper electrode layer 104. Also, the interconnect layer 107-1 is formed to be drawn out from the lower electrode layer 102 onto the protective layer 105. Further, the interconnect layer 107-2 is formed to be drawn out from the upper electrode layer 104 onto the protective layer 105.

Patent Document 1: JP 06-89831 A

In the dielectric thin film element of Patent Document 1, the area of parts of the interconnect layers 107-1, 107-2 that are respectively in contact with the lower electrode layer 102 and the upper electrode layer 104 is small. For this reason, there has been a problem such that, when a stress is applied from the outside to the interconnect layers 107-1, 107-2, the interconnect layers 107-1, 107-2 are liable to be exfoliated from the lower electrode layer 102 and the upper electrode layer 104. Also, the interconnect layers 107-1, 107-2 are in a state in which the surface thereof is exposed, thereby raising a problem of being liable to be oxidized and corroded. Each of these problems causes decrease in the humidity resistance of the dielectric thin film element.

SUMMARY OF THE INVENTION

The present invention has been made in view of these circumstances, and an object thereof is to provide a dielectric thin film element having a high humidity resistance by alleviating the stress applied onto the interconnect layers and restraining the oxidation and corrosion of the interconnect layers.

A dielectric thin film element according to the present invention includes a capacitance section having a dielectric layer and a pair of electrode layers on upper and lower surfaces of the dielectric layer; a protection layer on the capacitance section; a pair of interconnect layers that extend along an inner surface of openings formed to penetrate through the protection layer so that the respective surfaces of the electrode layers are exposed, so as to be respectively in contact with the electrode layers and drawn out to an upper surface of the protection layer; a surface metal layer on a surface of the interconnect layers; and external electrodes on a surface side of a part of the interconnect layers that is drawn out to the upper surface of the protection layer, which surface side is different from the surface that is in contact with the protection layer, so as to be electrically connected to the interconnect layers, wherein the surface metal layer has at least first surface metal layers that cover a part of the interconnect layers that goes along the inner surface of the openings; and second surface metal layers that are formed on the upper surface of the protection layer and are in contact with an end of the first surface metal layers, the first surface metal layers are plated films, and the second surface metal layers are films made by the vacuum thin film method.

Also, in the dielectric thin film element according to the present invention, the first surface metal layers are preferably formed also on the surface of the part of the interconnect layers that is drawn out to the upper surface of the protection layer.

Also, in the dielectric thin film element according to the present invention, a material of the first surface metal layers preferably contains Ni as a major component.

Also, in the dielectric thin film element according to the present invention, a material of the second surface metal layers preferably contains one of Ti, Cr, and an alloy of Ni and Cr as a major component.

Also, in the dielectric thin film element according to the present invention, it is preferable that the interconnect layers have a structure made of a plurality of layers, and a material of the lowermost layer of the interconnect layers is the same as that of the second surface metal layers.

Also, the present invention is directed to an antifuse element including a dielectric thin film element described above.

Also, the present invention provides a method of producing a dielectric thin film element constructed as described below.

The method of producing a dielectric thin film element according to the present invention includes a step of forming a capacitance section having a dielectric layer and a pair of electrode layers formed on upper and lower surfaces of the dielectric layer; a step of forming a protection layer so as to cover the capacitance section; a step of forming openings that penetrate through the protection layer so that the respective surfaces of the electrode layers are exposed; a step of forming a pair of interconnect layers along an inner surface of the openings so as to be respectively in contact with the electrode layers and to be drawn out to an upper surface of the protection layer; a step of forming second surface metal layers by the vacuum thin film method on a surface of the interconnect layers; a step of removing at least a part of the second surface metal layers that goes along the inner surface of the openings; and a step of forming first surface metal layers by the plating method on the part from which the second surface metal layers have been removed.

Also, in the method of producing a dielectric thin film element according to the present invention, the interconnect layers are preferably formed by the vacuum thin film method.

In the dielectric thin film element of the present invention, the first surface metal layers and the second surface metal layers formed on the surface of the interconnect layers play a role of restraining the corrosion and oxidation of the interconnect layers. In particular, since the first surface metal layers covering the part that goes along the inner surface of the openings are plated films, exfoliation of the interconnect layers from the electrode layers can be effectively prevented.

Also, in the dielectric thin film element of the present invention, the surface metal layer has at least the above-described first surface metal layers which are plated films and the second surface metal layers which are films made by the vacuum thin film method, and the ends thereof are in contact with each other, so that the stress that propagates from the external electrodes through the interconnect layers to the electrode layers can be alleviated.

From the above, a dielectric thin film element having a high humidity resistance can be obtained.

DETAILED DESCRIPTION OF THE PREFERRED EMBODIMENTS OF THE INVENTION

Figure 1:
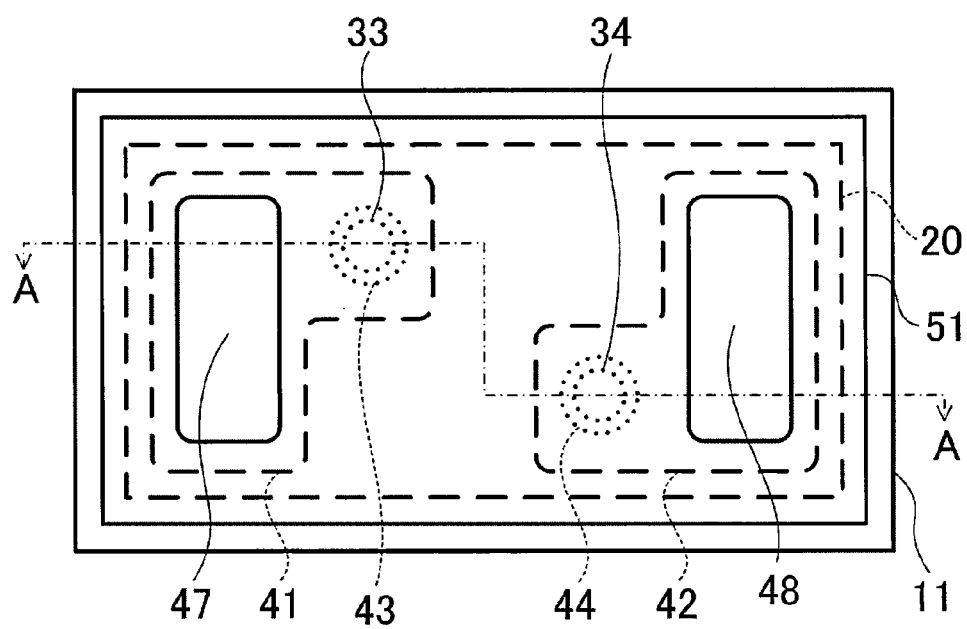
FIG. 1 is a plan view illustrating a dielectric thin film element according to the present invention (Experiment Example 1).
Figure 2:
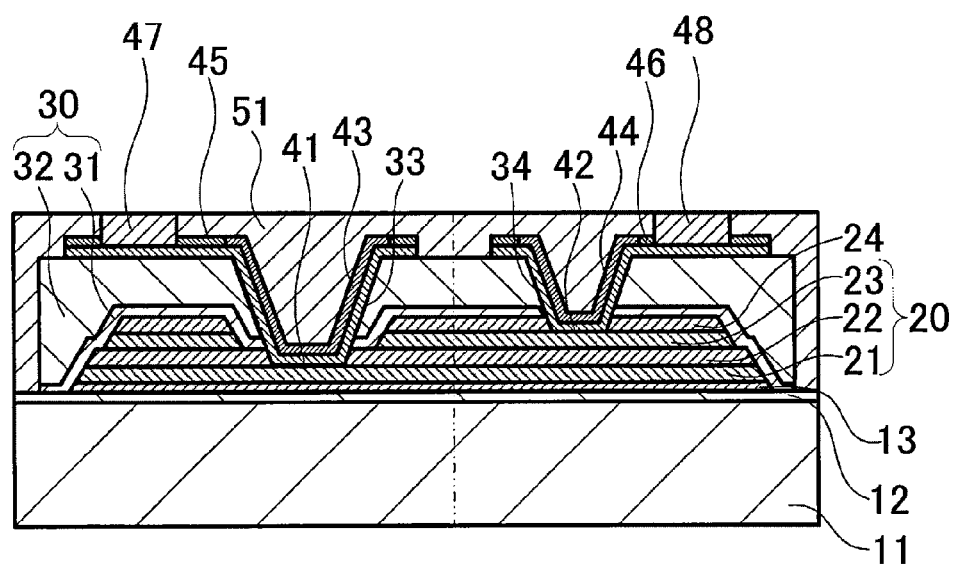
FIG. 2 is an A-A cross-sectional view of the dielectric thin film element illustrated in FIG. 1 (Experiment Example 1).
Figure 3:
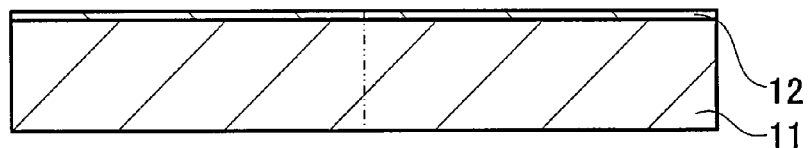
FIGS. 3(A) to 3(D) are cross-sectional views illustrating steps of a method of producing a dielectric thin film element according to the present invention.
Figure 3:
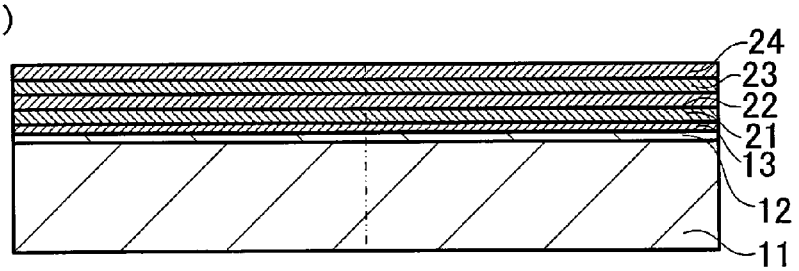
Figure 3:
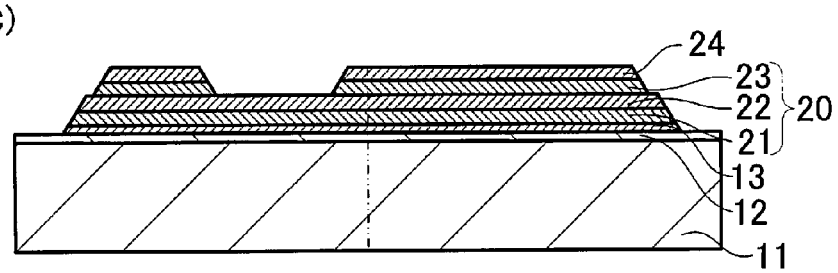
Figure 3:
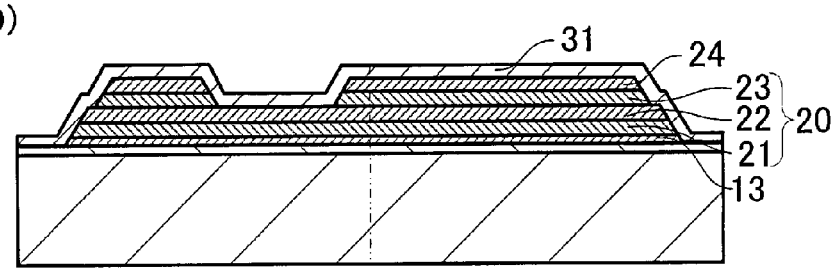
Figure 4:
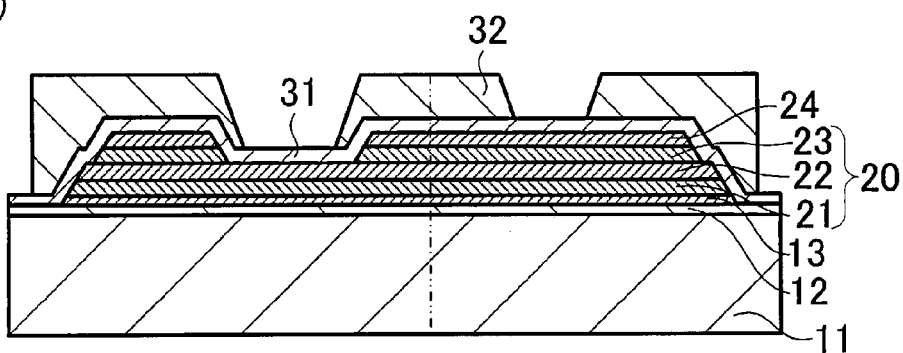
FIGS. 4(E) to 4(G) are cross-sectional views illustrating steps of a production method carried out after FIG. 3(d) in the method of producing a dielectric thin film element according to the present invention.
Figure 4:
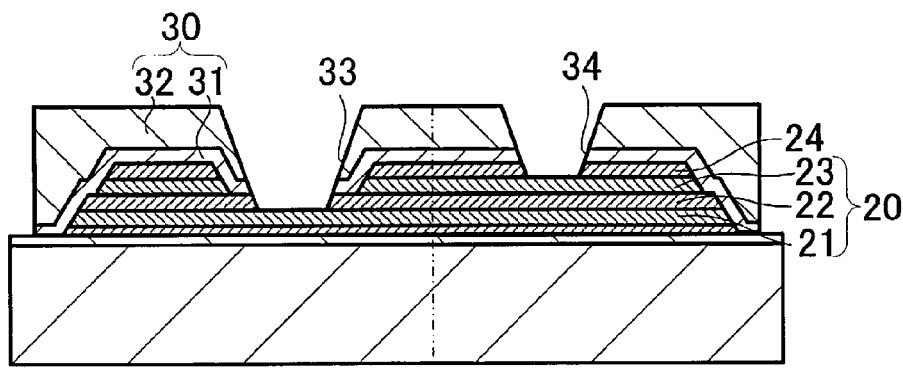
Figure 4:
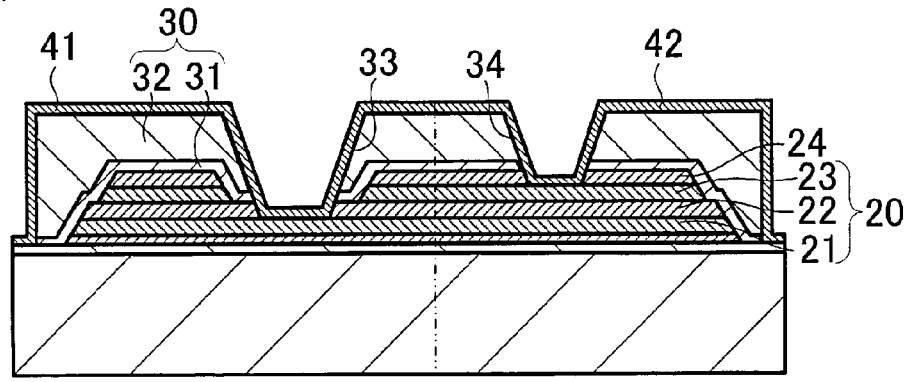
Figure 5:
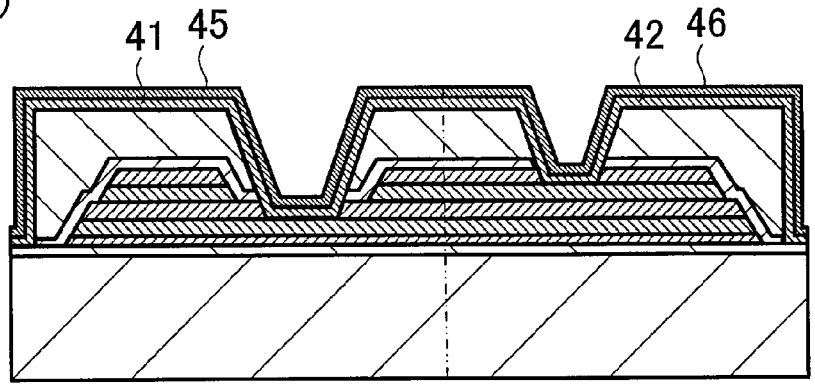
FIGS. 5(H) to 5(J) are cross-sectional views illustrating steps of a production method carried out after FIG. 4(G) in the method of producing a dielectric thin film element according to the present invention.
Figure 5:
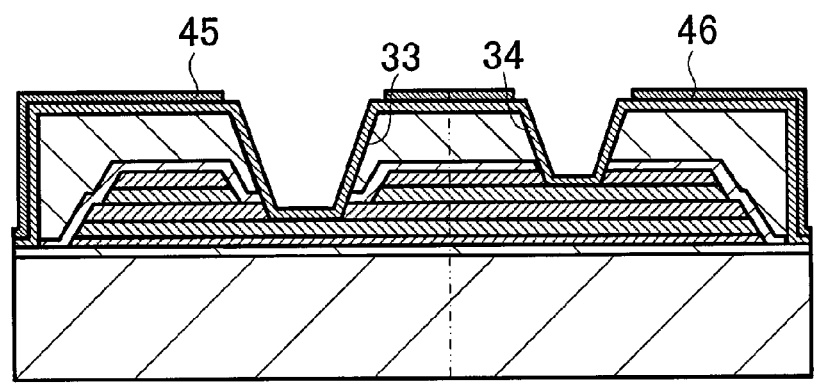
Figure 5:
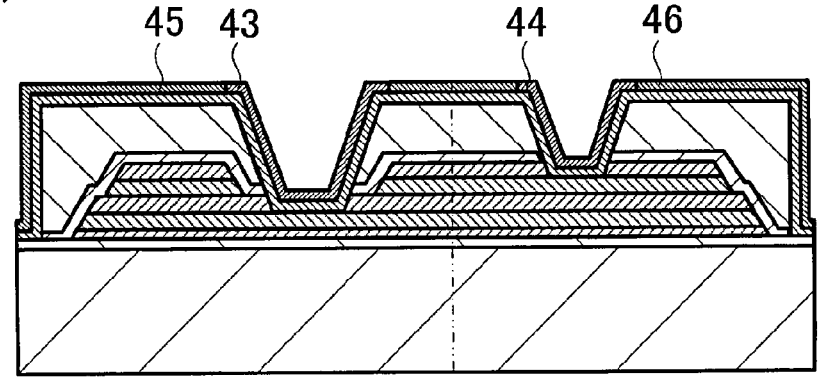
Figure 6:
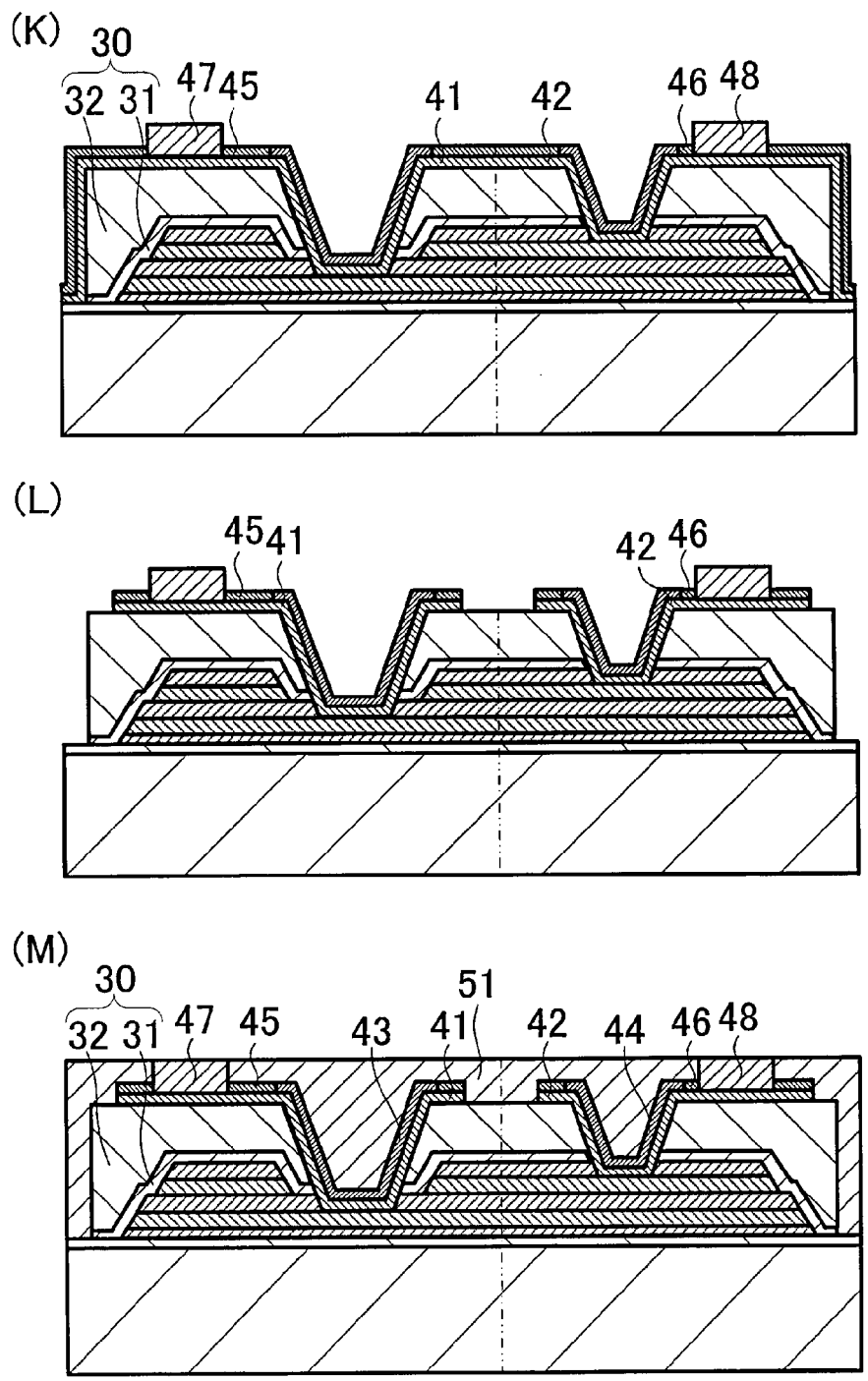
FIGS. 6(K) to 6(M) are cross-sectional views illustrating steps of a production method carried out after FIG. 5(J) in the method of producing a dielectric thin film element according to the present invention.

FIG. 1 is a plan view illustrating a dielectric thin film element 10 according to the present invention. Also, FIG. 2 is an A-A cross-sectional view of the dielectric thin film element 10 illustrated in FIG. 1. Here, for the sake of easy understanding, FIGS. 1 to 9 are given as model views.

The dielectric thin film element 10 is formed on a substrate 11 by using, for example, a thin film forming process. As an example of the substrate 11, an Si single-crystal substrate (hereafter referred to as "Si substrate") can be raised. Also, an oxide layer 12 is preferably formed on the surface of the substrate 11. The oxide layer 12 is formed, for example, by thermally treating the substrate 11.

On the oxide layer 12, a close-adhesion layer 13, a lower electrode layer 21, a dielectric layer 22, an upper electrode layer 23, and an inorganic insulation layer 24 are successively formed. A capacitance section 20 has the lower electrode layer 21, the dielectric layer 22, and the upper electrode layer 23.

The close-adhesion layer 13 is formed to ensure a close adhesion property between the oxide layer 12 and the lower electrode layer 21. When the materials of the close-adhesion layer 13 and the dielectric layer 22 are the same, the production is simplified.

As an example of the dielectric material used in the dielectric layer 22, (Ba, Sr)TiO$_3$ (hereafter referred to as "BST") can be raised.

The lower electrode layer 21 is formed on the lower surface of the dielectric layer 22. Also, the upper electrode layer 23 is formed on the upper surface of the dielectric layer 22. In the lower electrode layer 21 and the upper electrode layer 23, a metal material having an electric conductivity is used. Specifically, a noble metal having a high melting point with a good electric conductivity and with an excellent oxidation resistance is preferable. As examples of the noble metal, Au and Pt can be raised.

The inorganic insulation layer 24 is formed on the upper surface of the upper electrode layer 23. The inorganic insulation layer 24 is provided, for example, for the purpose of improving a close adhesion property between the upper electrode layer 23 and the protection layer 30. When the materials of the inorganic insulation layer 24 and the dielectric layer 22 are the same, the production is simplified.

The protection layer 30 is formed to cover the close adhesion layer 13, the capacitance section 20, and the inorganic insulation layer 24. The protection layer 30 is formed, for example, for the purpose of preventing penetration of moisture into the capacitance section 20. In the present embodiment, the protection layer 30 has an inorganic protection layer 31 and an organic protection layer 32. As examples of the material of the inorganic protection layer 31, SiN$_x$, SiO$_2$, Al$_2$O$_3$, and TiO$_2$ can be raised. Also, as examples of the material of the organic protection layer 32, a polyimide resin and an epoxy resin can be raised.

The openings 33, 34 are formed to penetrate through the protection layer 30 so that the surfaces of the lower electrode layer 21 and the upper electrode layer 23 are respectively exposed. Further, the interconnect layers 41, 42 are formed along the inner surface of the openings 33, 34 and are respectively in contact with the lower electrode layer 21 and the upper electrode layer 23. Further, the interconnect layers 41, 42 are drawn out to the upper surface of the protection layer 30. The interconnect layers 41, 42 are constructed to have, for example, a double-layer structure including an interconnect close-adhesion layer and an interconnect metal layer (not illustrated in the drawings). The interconnect close-adhesion layer is a lower layer of the double-layer structure, and the interconnect metal layer is an upper layer of the double-layer structure. The interconnect close-adhesion layer is formed to ensure a close adhesion property to the underlying layer. As an example of the material of the interconnect close-adhesion layer, Ti can be raised. Also, the interconnect metal layer is formed to ensure an electric conductivity of the interconnect layers. As an example of the material of the interconnect metal layer, Cu can be raised. When the interconnect close-adhesion layer and the second surface metal layers 45, 46 mentioned later are made of the same material, the element can be advantageously produced at a lower cost.

A surface metal layer is formed on the surface of the interconnect layers 41, 42, and the surface metal layer respectively has first surface metal layers 43, 44 and second surface metal layers 45, 46. The first surface metal layers 43, 44 and the second surface metal layers 45, 46 formed on the surface of the interconnect layers 41, 42 play a role of restraining the corrosion and oxidation of the interconnect layers 41, 42.

An external electrode 47 is formed on a surface side of a part of the interconnect layer 41 that is drawn out to the upper surface of the protection layer 30, which surface side is different from the surface that is in contact with the protection layer 30, so as to be electrically connected to the interconnect layer 41. Also, an external electrode 48 is formed on a surface side of a part of the interconnect layer 42 that is drawn out to the upper surface of the protection layer 30, which surface side is different from the surface that is in contact with the protection layer 30, so as to be electrically connected to the interconnect layer 42.

An organic insulation layer 51 is formed to cover the protection layer 30, the interconnect layers 41, 42, the first surface metal layers 43, 44, and the second surface metal layers 45, 46 so that the external electrodes 47, 48 are exposed. As examples of the material of the organic insulation layer 51, a polyimide resin and an epoxy resin can be raised.

In the present embodiment, the first surface metal layers 43, 44 are formed of a plated film so as to cover a part of the interconnect layers 41, 42 that goes along an inner surface of the openings 33, 34. For this reason, exfoliation of the interconnect layers 41, 42 from the electrode layers can be effectively prevented. In particular, in the present embodiment, the openings 33, 34 have a side surface and a bottom surface, and a stress is concentrated on a boundary between the side surface and the bottom surface. For this reason, it is sufficient that the first surface metal layers 43, 44 are formed at least at a part corresponding to the boundary between the side surface and the bottom surface.

The material of the first surface metal layers 43, 44 preferably contains Ni as a major component. This is because, in this case, the above-described effect is conspicuous.

Further, the first surface metal layers 43, 44 are preferably formed by the electrolytic plating method. This is because, in this case, the element can be produced at a lower cost.

The second surface metal layers 45, 46 are films made by the vacuum thin film method. In the present specification, the vacuum thin film method refers to a method of forming a film in vacuum, such as the vapor deposition method, the sputtering method, or the MOCVD (Metal Organic Vapor Deposition; organic metal gas-phase growth method). The second surface metal layers 45, 46 are formed on the surface of the interconnect layers 41, 42 located on the upper surface of the protection layer 30 and are in contact with the external electrodes 47, 48. In other words, when the stress propagating from the external electrodes 47, 48 is on the point of reaching the openings 33, 34 via the second surface metal layers 45, 46 and the first surface metal layers 43, 44, this stress is greatly alleviated at the linkage part between the second surface metal layers 45, 46 and the first surface metal layers 43, 44.

The material of the second surface metal layers 45, 46 preferably contains Ti, Cr, or an alloy of Ni and Cr as a major component. These materials form an oxide layer on the surface of the second surface metal layers 45, 46. For this reason, oxidation and corrosion of the interconnect layers 41, 42 can be more effectively restrained.

It is preferable that the first surface metal layers 43, 44 are formed also on the surface of the part of the interconnect layers 41, 42 that is drawn out to the upper surface of the protection layer 30. In this case, the end of the first surface metal layers 43, 44 and the end of the second surface metal layers 45, 46 are in contact with each other on the upper surface of the protection layer 30 of the interconnect layers 41, 42. In this case, the effect of restraining the stress will be larger. Also, when the end of the first surface metal layers 43, 44 and the end of the second surface metal layers 45, 46 are in contact with each other in a neighborhood of the openings 43, 44, the effect of restraining the stress will be further larger.

Also, the present invention is directed to an antifuse element provided with a dielectric thin film element described above. The antifuse element is an electronic component that is short-circuited to allow an electric current to flow when a voltage having a predetermined value or more is applied. In the case of the present embodiment, the element is short-circuited by application of a voltage having a predetermined value or more between the external electrodes 47, 48 to cause insulation breakdown of the dielectric layer 22 between the lower electrode layer 21 and the upper electrode layer 23. Supposing that the insulation breakdown occurs immediately below the openings 33, 34, there is a fear that the interconnect layers 41, 42 may get caught up to be disconnected at the time of insulation breakdown, and a poor release may occur in the antifuse element itself. In the case of the present invention, however, the insulation breakdown of the dielectric layer 22 after voltage application is less liable to occur immediately below the openings 33, 34. Therefore, an antifuse element with less fear of poor release is obtained.

Here, in the present embodiment, the dielectric layer 22 in the capacitance section 20 is made of a single layer. However, in order to ensure electrostatic capacitance, the capacitance section 20 may have a structure such that a plurality of dielectric layers and electrode layers are alternately disposed.

Also, in the present embodiment, the inorganic insulation layer 24 is disposed so as to improve, for example, the close adhesion property between the upper electrode layer 23 and the protection layer 30. However, the inorganic insulation layer 24 is not necessarily needed.

Next, one example of a method of producing a dielectric thin film element described above will be described in detail with reference to FIGS. 3 to 6.

First, a substrate 11 is prepared as shown in FIG. 3(A). For example, an Si substrate in which an $SiO_2$ layer having a thickness of 500 to 1000 nm is formed as an oxide layer 12 is prepared. The $SiO_2$ layer is formed, for example, by thermally treating the Si substrate.

Next, a capacitance section 20 is formed as shown in FIGS. 3(B) and 3(C).

First, as shown in FIG. 3(B), a close-adhesion layer 13, a lower electrode layer 21, a dielectric layer 22, an upper electrode layer 23, and an inorganic insulation layer 24 are successively formed on the oxide layer 12 of the substrate 11.

First, the close-adhesion layer 13 is formed on the oxide layer 12. As the close-adhesion layer 13, a BST layer having a thickness of 10 to 100 nm is formed, for example. The close-adhesion layer 13 is formed, for example, by the chemical solution deposition method. Specifically, a dielectric source material solution containing an organic metal compound is applied by spin coating on the upper surface of the Si substrate in which the $SiO_2$ layer has been formed, so as to attain Ba:Sr:Ti=70:30:100 (molar ratio). Thereafter, the substrate is dried at 300 to 400° C. by means of a hot plate. Thereafter, a thermal treatment is carried out under the conditions of 600 to 700° C. for 10 to 60 minutes.

Next, the capacitance section 20 having the lower electrode layer 21, the dielectric layer 22, and the upper electrode layer 23 is formed on the close-adhesion layer 13. First, the lower electrode layer 21 is formed on the close-adhesion layer 13. As the lower electrode layer, a Pt layer having a thickness of 100 to 500 nm is formed by the sputtering method, for example. Thereafter, the dielectric layer 22 is formed on the lower electrode layer 21. As the dielectric layer 22, for example, a BST layer having a thickness of 50 to 200 nm is formed by a method similar to that of the above-described close-adhesion layer 13. Thereafter, the upper electrode layer 23 is formed on the dielectric layer 22. As the upper electrode layer 23, for example, a Pt layer having a thickness of 100 to 500 nm is formed by a method similar to that of the above-described Pt layer.

Next, the inorganic insulation layer 24 is formed on the capacitance section 20. As the inorganic insulation layer 24, for example, a BST layer having a thickness of 10 to 100 nm is formed by a method similar to that of the close-adhesion layer 13 and the dielectric layer 22.

Next, as shown in FIG. 3(C), the inorganic insulation layer 24, the upper electrode layer 23, the dielectric layer 22, the lower electrode layer 21, and the close-adhesion layer 13 are patterned. First, the inorganic insulation layer 24 and the upper electrode layer 23 are patterned. For example, a resist is applied on the inorganic insulation layer 24 by the photolithography method, and a resist mask is formed by successively carrying out exposure to light, development, and curing. Then, after the resultant is patterned into a predetermined shape by the Ar ion milling method, the resist mask is removed by ashing. By a similar method, the dielectric layer 22, the lower electrode layer 21, and the close-adhesion layer 13 are patterned, and thereafter the resist mask is removed. At this time, the inorganic insulation layer 24 and the upper electrode layer 23 can be patterned at one time. Also, the dielectric layer 22, the lower electrode layer 21, and the close-adhesion layer 13 can be patterned at one time. In this case, the patterning can be carried out at a lower cost as compared with a case of separately and individually carrying out the patterning.

Next, a thermal treatment is carried out at 700 to 900° C. for 30 minutes in accordance with the needs.

Next, a protection layer 30 is formed in the following manner so as to cover the exposed portions of the close-adhesion layer 13, the capacitance section 20, and the inorganic insulation layer 24.

First, an inorganic protection layer 31 is formed so as to cover the close-adhesion layer 13, the capacitance section 20, and the inorganic insulation layer 24, as shown in FIG. 3(D). The thickness of the inorganic protection layer 31 is, for example, 200 to 1000 nm. As the inorganic protection layer 31, an $SiO_2$ film is formed, for example. The inorganic protection layer 31 is formed, for example, by a vacuum thin-film method such as the PECVD (Plasma-Enhanced CVD) method or the sputtering method.

Then, an organic protection layer 32 is formed on the inorganic protection layer 31, as shown in FIG. 4(E). The thickness of the organic protection layer 32 is, for example, 2 to 10 μm. The organic protection layer 32 is patterned, for example, by spin-coating with a photosensitive resin material and performing exposure to light, development, and curing, as will be described later. In this manner, the protection layer 30 is formed.

Next, as shown in FIG. 4(F), an opening 33 is formed to penetrate through the inorganic protection layer 31 and the dielectric layer 22 so that the surface of the lower electrode layer 21 may be exposed. Also, an opening 34 is formed to penetrate through the inorganic protection layer 31 and the inorganic insulation layer 24 so that the surface of the upper electrode layer 23 may be exposed. Specifically, with use of the organic protection layer 32 as a resist mask, the inorganic protection layer 31, the dielectric layer 22, and the inorganic insulation layer 24 are patterned, for example, by using a $CHF_3$ gas. At this time, when the dielectric layer 22 and the inorganic insulation layer 24 are made of the same material, the patterning can be carried out at a lower cost.

Next, interconnect layers 41, 42 are formed as shown in FIG. 4(G). The interconnect layer 41 goes along the opening 33 to be in contact with the lower electrode layer 21. Also, the interconnect layer 42 goes along the opening 34 to be in contact with the upper electrode layer 23. Then, the interconnect layers 41, 42 are formed to be drawn out up to the upper surface of the protection layer 30. The interconnect layers 41, 42 are formed, for example, by a vacuum thin-film method such as the sputtering method.

Next, as shown in FIG. 5(H), second surface metal layers 45, 46 are formed on the surface of the interconnect layers 41, 42 by a vacuum thin-film method. When the interconnect layers 41, 42 are formed by a vacuum thin-film method, the second surface metal layers 45, 46 may be formed continuously with the interconnect layers 41, 42.

Next, as shown in FIG. 5(I), at least a part of the second surface metal layers 45, 46 that goes along the inner surface of the openings 33, 34 is removed. Specifically, for example, a resist mask is formed by the photolithography method, and removal is carried out by wet etching.

Next, as shown in FIG. 5(J), first surface metal layers 43, 44 are formed by the plating method on the part from which the second surface metal layers 45, 46 have been removed. At this time, when the surface of the second surface metal layers 45, 46 are oxidized, the second surface metal layers 45, 46 act as a mask of the plating.

Next, external electrodes 47, 48 are formed as shown in FIG. 6(K). The external electrodes 47, 48 are formed on a surface side of a part of the interconnect layers 41, 42 that is drawn out to the upper surface of the protection layer 30, which surface side is different from the surface that is in contact with the protection layer 30, so as to be electrically connected to the interconnect layers 41, 42. Specifically, a resist mask is formed by the photolithography method, and a part of the second surface metal layers 45, 46 is removed. Thereafter, the external electrodes 47, 48 are formed on the part from which the second surface metal layers 45, 46 have been removed, so as to be in contact with the interconnect layers 41, 42. The external electrodes 47, 48 are formed, for example, by the plating method. Also, it is preferable that the external electrodes 47, 48 are directly in contact with the interconnect layers 41, 42, respectively; however, they may be in electrical contact via another layer.

Next, as shown in FIG. 6(L), the interconnect layers 41, 42 and the second surface metal layers 45, 46 are patterned. Specifically, for example, a resist mask is formed by the photolithography method, and patterning is carried out by wet etching.

Finally, as shown in FIG. 6(M), an organic insulation layer 51 is formed so as to cover the protection layer 30, the interconnect layers 41, 42, the first surface metal layers 43, 44, and the second surface metal layers 45, 46. The organic insulation layer 51 is formed so that the external electrodes 47, 48 may be exposed. Specifically, the organic insulation layer 51 is formed, for example, by spin-coating with an epoxy resin and successively performing exposure to light, development, and curing. The thickness of the organic insulation layer 51 is, for example, 2 to 10 μm.

In the above-described manner, the dielectric thin film element is fabricated.

Here, when a plurality of dielectric thin film elements are formed simultaneously on one sheet of a substrate, individual dielectric thin film elements may be taken out from the substrate by cutting.

Also, in the present embodiment, the first surface metal layers 43, 44 and the external electrodes 47, 48 are separately formed; however, they may be formed simultaneously. In this case, the element can be produced at a lower cost.

Here, the present invention is not limited to the above-described embodiment. The thickness of each layer, the method of forming, and the conditions for forming are simply exemplifications. Therefore, they can be changed in an arbitrary manner within a range that does not deteriorate the functions of the dielectric thin film element.

EXPERIMENT EXAMPLES

Dielectric thin film elements were fabricated in the following manner.

As Experiment Example 1, a dielectric thin film element such as shown in FIG. 2 was fabricated.

First, an Si substrate in which an $SiO_2$ layer having a thickness of 700 nm had been formed as an oxide layer was prepared.

Next, a BST layer having a thickness of 50 nm was formed on the substrate as a close-adhesion layer.

Specifically, a dielectric source material solution containing an organic metal compound was applied by spin coating on the upper surface of the Si substrate in which the oxide layer had been formed, so as to attain Ba:Sr:Ti=70:30:100 (molar ratio). Thereafter, the substrate was dried under conditions of 350° C. on a hot plate. Thereafter, a thermal treatment was carried out at 650° C. for 30 minutes.

Next, a Pt layer having a thickness of 200 nm was formed on the close-adhesion layer as a lower electrode layer. The Pt layer was formed by the sputtering method.

Next, a dielectric layer and an upper electrode layer were successively formed. Specifically, a BST layer having a thickness of 90 nm was formed on the Pt layer by a method similar to that of the above-described BST layer. Thereafter, a Pt layer having a thickness of 200 nm was formed on the BST layer by a method similar to that of the above-described Pt layer.

Next, an inorganic insulation layer was formed on the upper electrode layer. Specifically, a BST layer having a thickness of 90 nm was formed on the Pt layer by a method similar to that of the above-described BST layer.

Next, the inorganic insulation layer and the upper electrode layer were patterned. Thereafter, the dielectric layer, the lower electrode layer, and the close-adhesion layer were patterned. Specifically, first, a resist mask was formed by the photolithography method on the BST layer which was the inorganic insulation layer. Thereafter, the inorganic insulation layer and the upper electrode layer were patterned into a predetermined shape by the Ar ion milling method. Thereafter, the dielectric layer, the lower electrode layer, and the close-adhesion layer were patterned by a similar method.

Next, a thermal treatment was carried out at 850° C. for 30 minutes on the above-described stacked structure.

Next, an inorganic protection layer was formed. Specifically, an $SiO_2$ layer having a thickness of 700 nm was formed by the PECVD method.

Next, an organic protection layer was formed on the inorganic protection layer. Specifically, a polyimide resin layer having a thickness of 6 μm was formed by spin-coating with a photosensitive polyimide and successively performing exposure to light, development, and curing.

Next, with use of the organic protection layer as a resist mask, the inorganic protection layer was patterned by using a $CHF_3$ gas. At this time, openings were formed so as to expose a part of the surface of the upper electrode layer and a part of the surface of the lower electrode layer.

Next, interconnect layers and second surface metal layers were formed by the magnetron sputtering method. Specifically, a double-layer structure including a Ti layer (layer thickness of 100 nm) and a Cu layer (layer thickness of 1000 nm) was formed as the interconnect layers. Thereafter, a Ti layer (100 nm) was continuously formed as the second surface metal layers.

Next, after a part of the second surface metal layers was removed, first surface metal layers were formed. Specifically, a resist mask was formed by the photolithography method, and a part of the Ti layer which was the second surface metal layers formed in the openings was removed. Thereafter, a Ni layer of 0.5 μm was formed as the first surface metal layers on the part from which the part of the Ti layer had been removed. The Ni layer was formed by the electrolytic plating method.

Next, external electrodes were formed. Specifically, a resist mask was formed by the photolithography method, and a part of the Ti layer of the second surface metal layers drawn out up to the upper surface of the protection layer was removed. Thereafter, a double-layer structure including a Ni layer having a thickness of 2 μm and an Au layer having a thickness of 1 μm was formed as the external electrodes. The Ni layer and the Au layer were formed by the electrolytic plating method.

Next, the interconnect layers and the second surface metal layers were patterned. Specifically, a resist mask was formed by the photolithography method, and a part of the interconnect layers and a part of the second surface metal layers were removed.

Next, an organic insulation layer was formed so that the external electrodes may be exposed. Specifically, an epoxy resin layer having a thickness of 8 μm was formed by spin-coating with an epoxy resin and successively performing exposure to light, development, and curing.

Finally, the dielectric thin film element was taken out by cutting the substrate.

Figure 7:
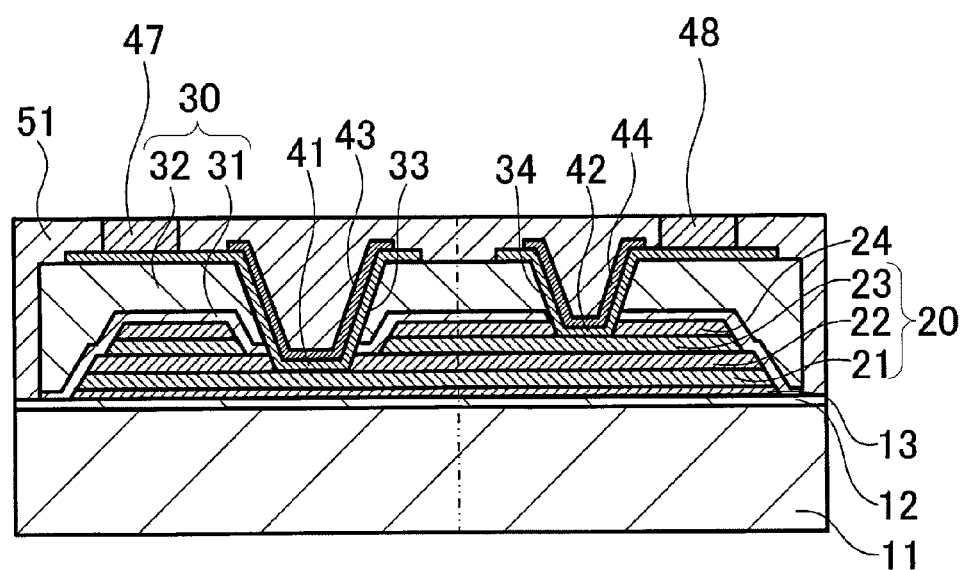
FIG. 7 is a cross-sectional view illustrating a Comparative Example 1 of a dielectric thin film element.

FIG. 7 illustrates Comparative Example 1 of a dielectric thin film element that was fabricated by the inventors. The dielectric thin film element shown in FIG. 7 has a structure such that the first surface metal layers 43, 44 are formed but the second surface metal layers are not formed. The element has a construction similar to that of Experiment Example 1 except for the above and was fabricated through a process similar to that of Experiment Example 1.

Figure 8:
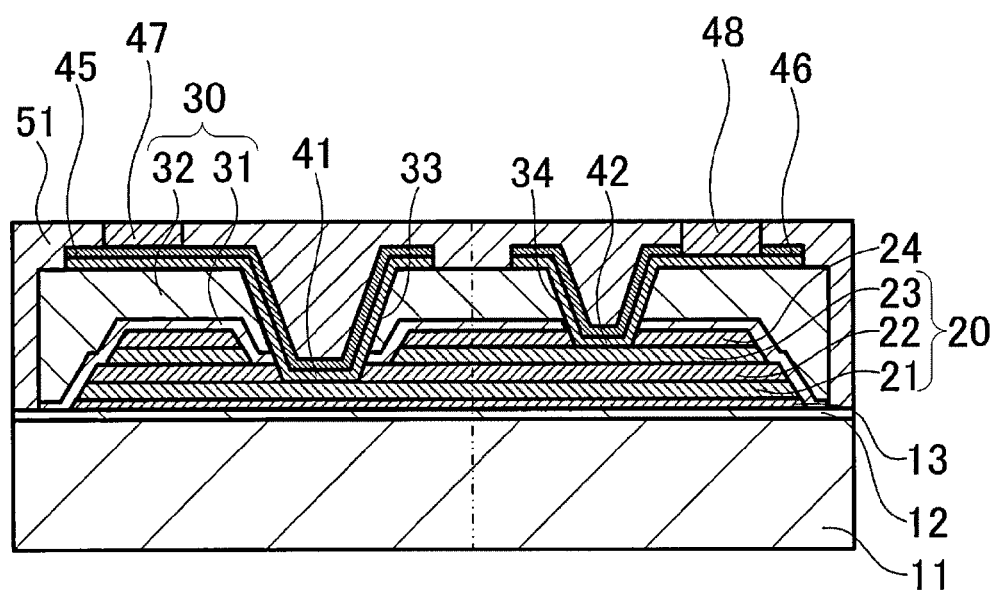
FIG. 8 is a cross-sectional view illustrating a Comparative Example 2 of a dielectric thin film element.

FIG. 8 illustrates Comparative Example 2 of a dielectric thin film element that was fabricated by the inventors. The dielectric thin film element shown in FIG. 8 has a structure such that the first surface metal layers are not formed and the second surface metal layers 45, 46 are formed also on the inner surface of the openings. The element has a construction similar to that of Experiment Example 1 except for the above and was fabricated through a process similar to that of Experiment Example 1.

Figure 9:
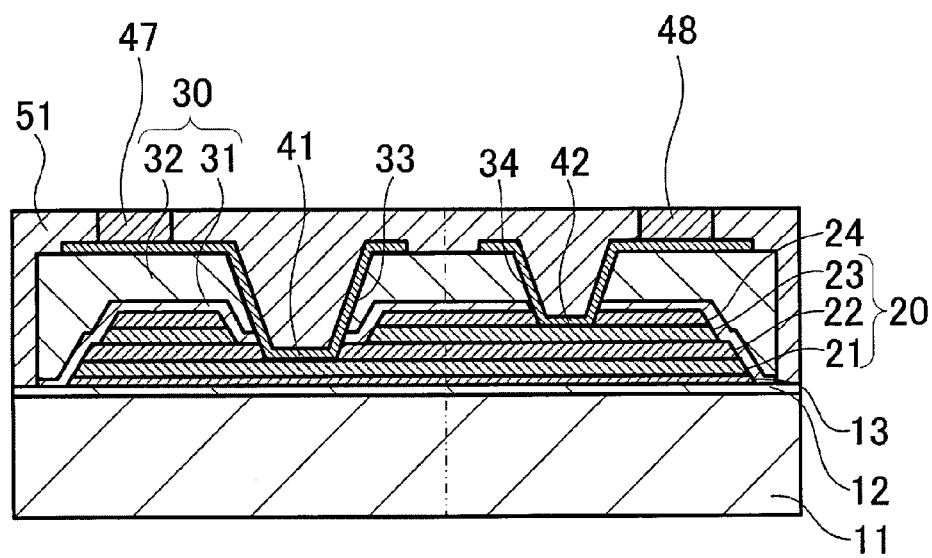
FIG. 9 is a cross-sectional view illustrating a Comparative Example 3 of dielectric thin film element.

FIG. 9 illustrates Comparative Example 3 of a dielectric thin film element that was fabricated by the inventors. The dielectric thin film element shown in FIG. 9 has a structure such that neither the first surface metal layers nor the second surface metal layers are formed. The element has a construction similar to that of Experiment Example 1 except for the above and was fabricated through a process similar to that of Experiment Example 1.

The following evaluation was carried out by the inventors on the obtained dielectric thin film elements of Experiment Example 1 and Comparative Examples 1 to 3.

Figure 10:
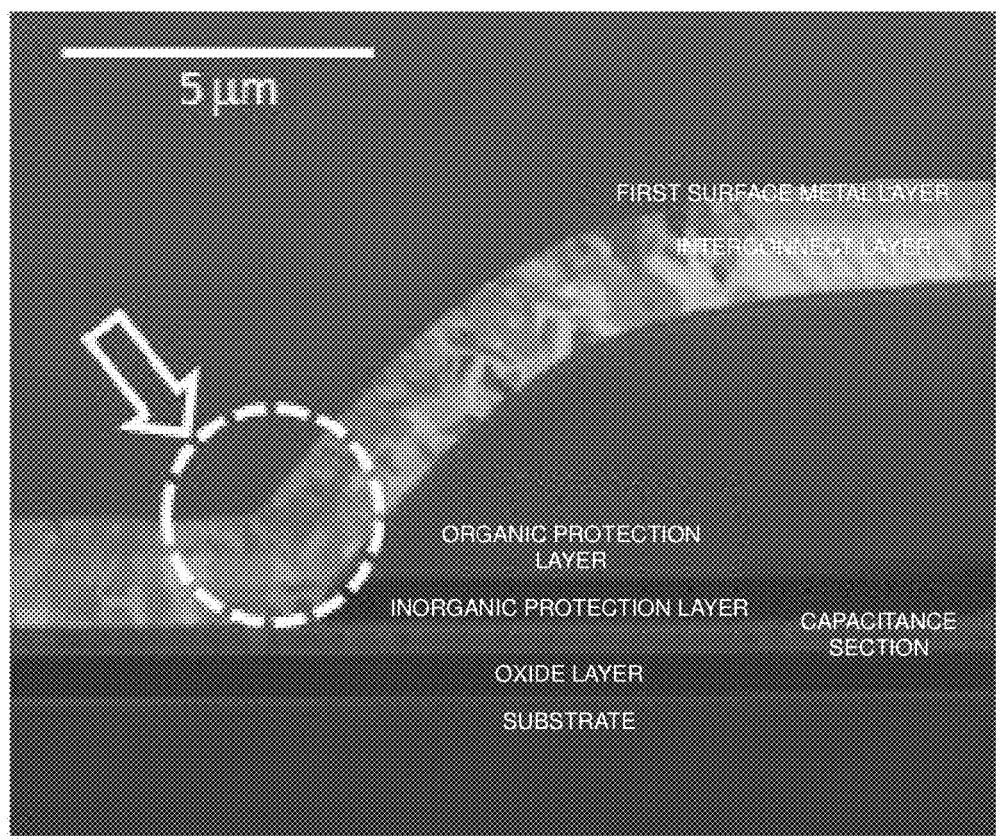
FIG. 10 is an SEM photograph showing a cross-section of the dielectric thin film element of Experiment Example 1 illustrated in FIG. 1.
Figure 11:
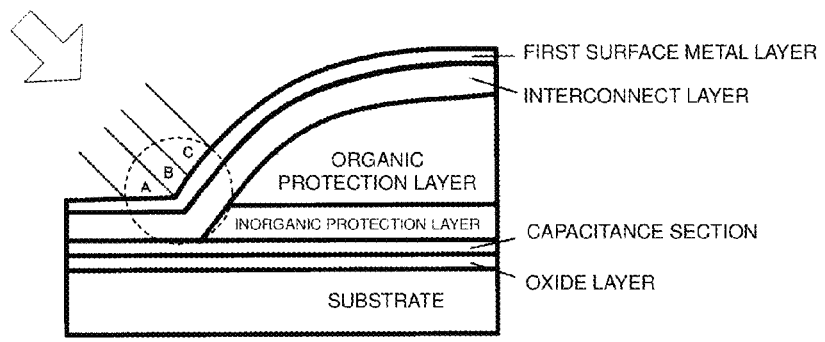
FIG. 11 is a model view of FIG. 10.
Figure 12:
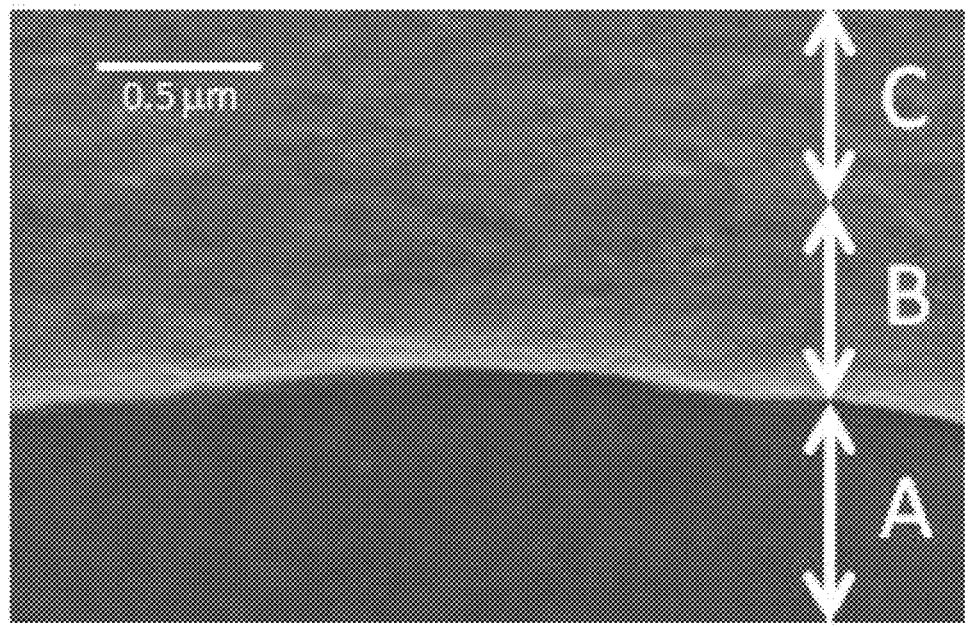
FIG. 12 is an FIB photograph of the circle part of FIG. 10.

First, with respect to the dielectric thin film element of Experiment Example 1, a neighborhood of the boundary between the bottom surface and the side surface of the opening was observed. FIG. 10 is an SEM photograph showing a cross-section of the dielectric thin film element of Experiment Example 1. FIG. 11 is a model view of FIG. 10. Also, FIG. 12 is an FIB photograph in which the circle part of FIG. 11 is observed from the arrow direction. In FIG. 12, the surface of the first surface metal layer is observed. Among the parts of the first surface metal layer in the circle part of FIG. 11, the part corresponding to the bottom surface of the opening is referred to as A; the part immediately under which the inorganic protection layer is located is referred to as B; and the part immediately under which the organic protection layer is located is referred to as C.

Figure 13:
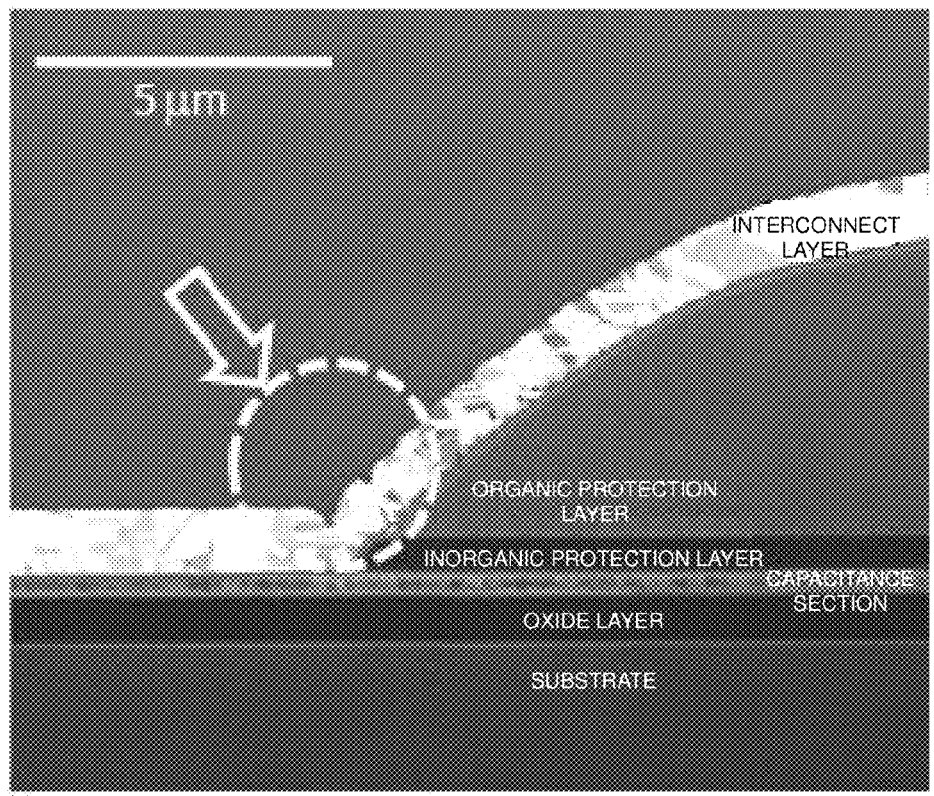
FIG. 13 is an SEM photograph showing a cross-section of the dielectric thin film element of Comparative Example 3 illustrated in FIG. 9.
Figure 14:
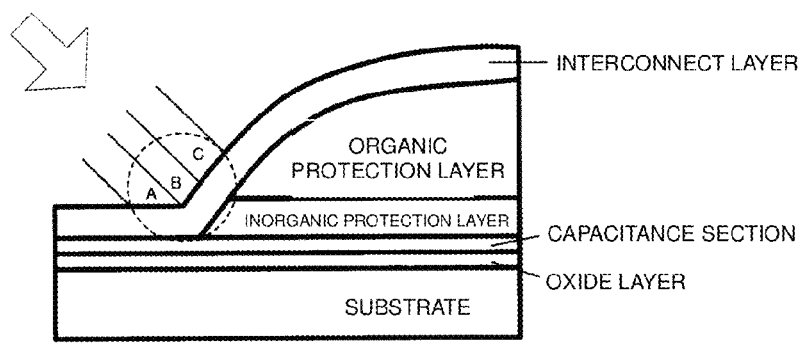
FIG. 14 is a model view of FIG. 13.
Figure 15:
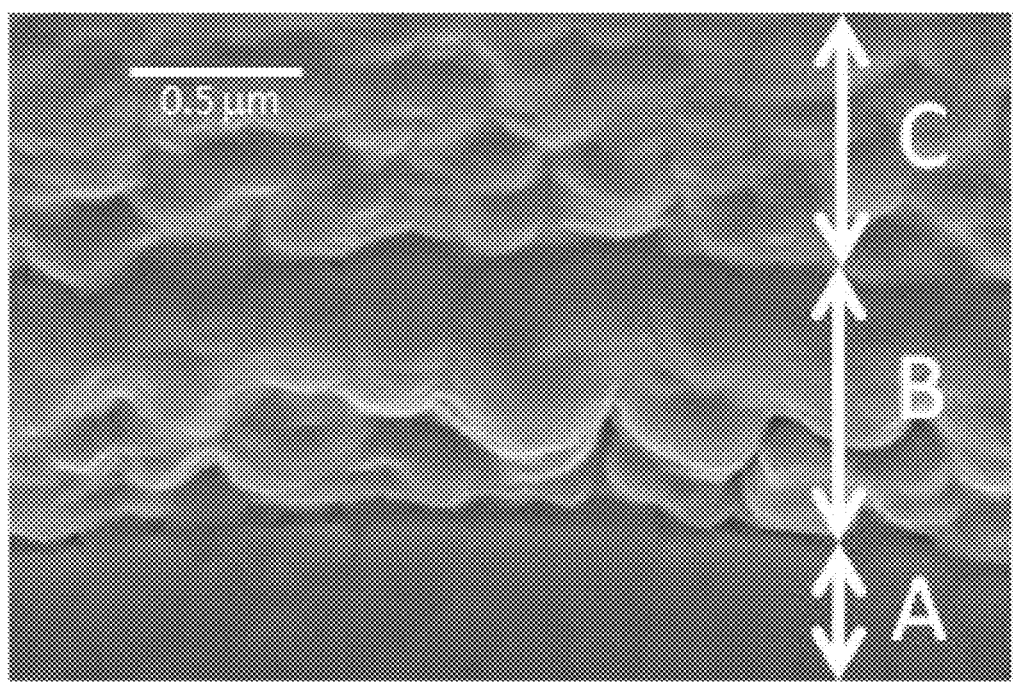
FIG. 15 is an FIB photograph of the circle part of FIG. 12.
Figure 16:
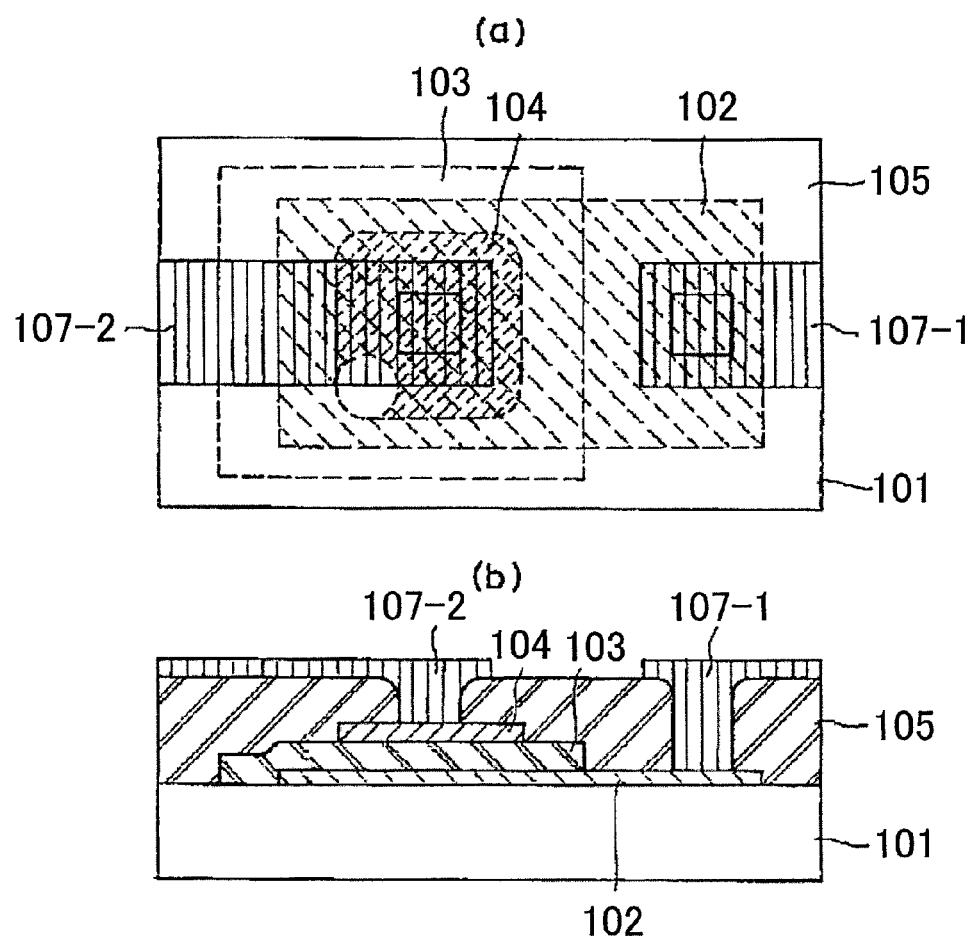
FIG. 16 is a plan view and a cross-sectional view illustrating a conventional dielectric thin film element.

Also, for the purpose of comparison, the dielectric thin film element of the third Comparative Example was also observed. FIG. 13 is an SEM photograph showing a cross-section of the dielectric thin film element of Comparative Example 3. FIG. 14 is a model view of FIG. 13. Also, FIG. 15 is an FIB photograph in which the circle part of FIG. 14 is observed from the arrow direction. In FIG. 15, the surface of the interconnect layer is observed. Among the parts of the interconnect layer in the circle part of FIG. 14, the part corresponding to the bottom surface of the opening is referred to as A; the part immediately under which the inorganic protection layer is located is referred to as B; and the part immediately under which the organic protection layer is located is referred to as C.

When FIG. 12 and FIG. 15 are compared, it will be understood that the surface of the first surface metal layers is smooth and flat as compared with the surface of the interconnect layers. Therefore, it is understood that the first surface metal layers cover and protect the inner surface of the openings while smoothening the unevenness of the interconnect layer surface.

Next, a humidity resistance load test (121° C., 85% RH, +4 V application) was carried out. Then, the number of dielectric thin film elements that went out of order after carrying out for 24 hours, after carrying out for 48 hours, and after carrying out for 96 hours was investigated. The number of samples was set to be 30. As the dielectric thin film elements, those having a rated voltage of 4 V and an insulation resistance of 50 MΩ or more were used. Then, the elements whose insulation resistance after the humidity resistance load test became 1 MΩ or less were regarded as being out of order.

Table 1 shows the number of samples that went out of order after the humidity resistance load test.

TABLE 1

| | test time | | |
|---|---|---|---|
| | 24 h | 48 h | 96 h |
| Experiment Example 1 | 0/30 | 0/30 | 0/30 |
| Comparative Example 1 | 1/30 | 1/30 | 1/30 |
| Comparative Example 2 | 0/30 | 0/30 | 5/30 |
| Comparative Example 3 | 1/30 | 1/30 | 11/30 |

From the results of the humidity resistance load test, it has been found out that, in Experiment Example 1 in which the first surface metal layer and the second surface metal layer had been formed, the samples did not go out of order, so that a dielectric thin film element having a high humidity resistance could be obtained. In contrast, in Comparative Example 1 in which only the first surface metal layer had been formed, one sample went out of order after 24 hours passed, and thereafter the rest of the samples did not go of order, and no change was seen even after 96 hours passed. Also, in Comparative Example 2 in which only the second surface metal layer had been formed, the samples did not go out of order after 24 hours passed; however, five samples went out of order after 96 hours passed. Also, in Comparative Example 3 in which none of the first surface metal layer and the second surface metal layer had been formed, one sample went out of order after 24 hours passed, and 11 samples went out of order after 96 hours passed.

DESCRIPTION OF REFERENCE SYMBOLS

10 dielectric thin film element
11 substrate
12 oxide layer
13 close-adhesion layer
20 capacitance section
21 lower electrode layer
22 dielectric layer
23 upper electrode layer
24 inorganic insulation layer
30 protection layer
31 inorganic protection layer
32 organic protection layer
33, 34 opening
41, 42 interconnect layer
43, 44 first surface metal layer
45, 46 second surface metal layer
47, 48 external electrode
51 organic insulation layer
101 substrate
102 lower electrode layer
103 dielectric layer
104 upper electrode layer
105 protection layer
107-1 interconnect layer
107-2 interconnect layer

The invention claimed is:
1. A dielectric thin film element, comprising:
a capacitance section having a dielectric layer with an upper surface and a lower surface, a first electrode layer on the upper surface, and a second electrode layer on the lower surface;
a protection layer on the capacitance section;
a first opening extending though the protection layer to expose the first electrode layer;

a second opening extending through the protection layer, the first electrode layer and the dielectric layer, to expose the second electrode layer;

a first interconnect layer having a first portion disposed on the protection layer and a second portion that extends through the first opening to the first electrode layer;

a second interconnect layer having a first portion disposed on the protection layer and a second portion that extends through the second opening to the second electrode layer;

a pair of external electrodes electrically coupled to the first and second interconnect layers, respectively;

first surface metal layers disposed on the respective second portions of each of the first and second interconnect layers; and second surface metal layers disposed directly on the respective first portions of the first and second interconnect layers.

2. The dielectric thin film element according to claim 1, wherein the first surface metal layers are plated films.

3. The dielectric thin film element according to claim 1, wherein the second surface metal layers are films formed by a vacuum thin film method.

4. The dielectric thin film element according to claim 1, wherein the second surface metal layers are in contact with respective ends of the first surface metal layers.

5. The dielectric thin film element according to claim 1, wherein a material of the first surface metal layers is Ni.

6. The dielectric thin film element according to claim 1, wherein a material of the second surface metal layers is selected from the group consisting of Ti, Cr, and an alloy of Ni and Cr.

7. The dielectric thin film element according to claim 1, wherein each of the first and second interconnect layers comprises a plurality of layers, and a material of at least one of the plurality of layers is the same material as the first surface metal layers.

8. The dielectric thin film element according to claim 1, wherein the pair of external electrodes is in direct contact with the first and second interconnect layers, respectively.

9. An antifuse element comprising the dielectric thin film element according to claim 1.

* * * * *